(12) United States Patent
Lee

(10) Patent No.: US 12,125,608 B2
(45) Date of Patent: Oct. 22, 2024

(54) DIFFERENTIAL PAIRED CABLE WITH COMPENSATION FUNCTIONS

(71) Applicant: James Cheng Lee, La Habra, CA (US)

(72) Inventor: James Cheng Lee, La Habra, CA (US)

( * ) Notice: Subject to any disclaimer, the term of this patent is extended or adjusted under 35 U.S.C. 154(b) by 0 days.

(21) Appl. No.: 18/220,405

(22) Filed: Jul. 11, 2023

(65) Prior Publication Data

US 2024/0021343 A1    Jan. 18, 2024

Related U.S. Application Data

(60) Provisional application No. 63/388,253, filed on Jul. 12, 2022.

(30) Foreign Application Priority Data

Jul. 10, 2023    (CN) ......................... 202310837645.X

(51) Int. Cl.
*H01B 11/00* (2006.01)
*H01B 7/18* (2006.01)
*H05K 9/00* (2006.01)

(52) U.S. Cl.
CPC ............. *H01B 11/002* (2013.01); *H01B 7/18* (2013.01); *H05K 9/0098* (2013.01)

(58) Field of Classification Search
CPC ............................ H05K 9/0098; H01B 11/002
See application file for complete search history.

(56) References Cited

U.S. PATENT DOCUMENTS

| | | | | |
|---|---|---|---|---|
| 2011/0100682 A1* | 5/2011 | Nonen | ................. | H01B 11/203 174/254 |
| 2011/0232941 A1* | 9/2011 | Sugiyama | ............ | H01B 11/203 174/250 |
| 2012/0285723 A1* | 11/2012 | Gundel | ................ | H01B 7/0823 174/113 R |
| 2014/0000930 A1* | 1/2014 | Gundel | ................. | H01B 11/00 174/105 R |
| 2015/0310965 A1* | 10/2015 | Huang | ................. | H01B 11/203 156/53 |
| 2015/0310966 A1* | 10/2015 | Huang | ................. | H01B 11/203 174/107 |
| 2019/0228877 A1* | 7/2019 | Sagawa | ................. | H01B 7/188 |

* cited by examiner

*Primary Examiner* — Hung V Ngo
(74) *Attorney, Agent, or Firm* — Lin & Associates Intellectual Property, Inc.

(57) ABSTRACT

The present invention provides a differential paired cable with compensation functions, including: a first wire; a second wire; a first insulating layer; a second insulating layer; a ground wire; and a shielding layer. By controlling at least one of a length difference between the first insulating layer and the second insulating layer exposed outside of the shielding layer to be greater than 0.1 mm, a diameter difference between the first wire and the second wire to be greater than 0.005 mm, and a length difference between a welding portion of the first wire and a welding portion of the second wire to be greater than 0.05 mm, a signal transmission rate of one of the first wire and the second wire is compensated, so as to reduce an intra pair skew of the differential paired cable.

11 Claims, 19 Drawing Sheets

DIFFERENTIAL PAIRED CABLE WITH COMPENSATION FUNCTIONS

CROSS-REFERENCE TO RELATED APPLICATION

This application claims priority of U.S. Provisional application No. 63/388,253, filed on Jul. 12, 2022, and Chinese application No. 202310837645.X, filed on Jul. 10, 2023, the content of which is incorporated herein in its entirety by reference.

BACKGROUND OF THE INVENTION

1. Field of the Invention

The present invention relates generally to a differential paired cable, in particular to a differential paired cable with compensation functions.

2. The Prior Arts

FIG. 1 is a perspective view of a conventional differential paired cable 100, and FIG. 2 is a top view of the conventional differential paired cable 100. As shown in FIGS. 1 and 2, the differential paired cable 100 include a first wire 110, a second wire 120, a first insulating layer 130, a second insulating layer 140, a ground wire 150 and a shielding layer 160. A diameter D1 of the first wire 110 is equal to a diameter D2 of the second wire 120, and a length L1 of a welding portion of the first wire 110 is equal to a length L2 of a welding portion of the second wire 120. The first insulating layer 130 covers an outer surface of the first wire 110, and one end of the first wire 110 is exposed outside of the first insulating layer 130. The second insulating layer 140 covers an outer surface of the second wire 120, and one end of the second wire 120 is exposed outside of the second insulating layer 140. The shielding layer 160 covers an outer surface of the ground wire 150, an outer surface of the first insulating layer 130 and an outer surface of the second insulating layer 140. One end of the first insulating layer 130, one end of the second insulating layer 140, one end of the ground wire 150 is respectively exposed outside of the shielding layer 160, and one end of the first wire 110 and one end of the second wire 120 are welded to one end of the ground wire 150. A length L3 of the first insulating layer 130 exposed outside of the shielding layer 160 is equal to a length L4 of the second insulating layer 140 exposed outside of the shielding layer 160.

Differential paired cables are various paired signal lines that use one wire to transmit positive signals and one wire to transmit negative signals. Ideally, external signal interference (noise) will act on the two wires in equal value or at the same time, and the positive and negative signals can cancel each other out. Excellent anti-interference ability can maintain low bit error rate while pursuing high transmission rate. In the era of big data, from server applications that transmit the largest amount of data to USB applications that are close to life, differential paired cables are almost ubiquitous.

In practice, there will be a slight time difference between the paired signals arriving at the receiving end, which is the intra pair skew. When transmitting signals with differential paired cables, the positive and negative signals need to arrive at the receiving end at the same time in order to correctly determine whether the logic state of the signal is "0" or "1"; otherwise, bit errors may occur. When the transmission rate is higher, the period will be shorter, and the specification and test method of intra pair skew need to be strictly controlled.

Since in some applications, the specification of the intra pair skew has been required to be tens or even several picoseconds (10 to the minus 12th power of a second), the general practice is to strictly control all of the slight processing differences and machine stability that may affect the intra pair skew in the manufacturing process of the differential paired cables, these differences include: (1) when the raw cable is produced, the difference between diameter of the first wire and the second wire; (2) the permittivity of the material of the insulating layer (controlled by the consistency of the dielectric constant and the tightness of the shielding layer); (3) when the finished differential paired cable (including assembled circuit boards and welding) is produced, the length difference between the first insulation layer and the second insulation layer exposed outside of the shielding layer; (4) when the finished differential paired cable (including assembled circuit board and welding) is produced, the length difference of the welding portion of the first wire and the welding portion of the second wire; and (5) whether the cutting of the shielding layer is smooth without exposing too much of the first insulating layer and the second insulating layer.

However, even if the above-mentioned differences have been strictly controlled, these differences will gradually increase the intra pair skew of the finished differential paired cable. When the back end of the production line observes that the intra pair skew of the finished differential paired cable has accumulated to an unacceptable level, the finished differential paired cable can only be scrapped, which is quite wasteful, and it is necessary to re-adjust the process before starting to manufacture the differential paired cable. This would increase manufacturing costs.

Furthermore, as the total length of the differential paired cable increases, the intra pair skew of the differential paired cable will continue to accumulate and be compensated, thereby limiting the length of the differential paired cable.

SUMMARY OF THE INVENTION

The main purpose of the present invention is to provide a differential paired cable with a compensation function, which can reduce the intra pair skew through the compensation function.

In order to achieve the foregoing purpose, the present invention provides a differential paired cable with compensation functions, including: a first wire; a second wire; a first insulating layer covering an outer surface of the first wire, and one end of the first wire is exposed outside of the first insulating layer; a second insulating layer covering an outer surface of the second wire, and one end of the second wire is exposed outside of the second insulating layer; a ground wire; and a shielding layer covering an outer surface of the first insulating layer, an outer surface of the second insulating layer and an outer surface of the ground wire, one end of the first insulating layer, one end of the second insulating layer, and one end of the ground wire are respectively exposed outside of the shielding layer, and one end of the first wire and one end of the second wire are welded to one end of the ground wire, wherein by controlling at least one of a length difference between the first insulating layer and the second insulating layer exposed outside of the shielding layer to be greater than 0.1 mm, a diameter difference between the first wire and the second wire to be greater than 0.005 mm, and a length difference between a welding portion of the first wire and a welding portion of the second wire to be greater than 0.05 mm, a signal transmission rate of one of the first wire and the second wire is compensated, so as to reduce an intra pair skew of the differential paired cable.

In some embodiments, when a signal transmission rate of the first wire is lower than a signal transmission rate of the second wire, a diameter of the first wire is equal to a diameter of the second wire, a length of the welding portion of the first wire is equal to a length of the welding portion of the second wire, and by controlling a length of the first insulating layer exposed outside of the shielding layer to be shorter than a length of the second insulating layer exposed outside of the shielding layer by more than about 0.1 mm, the signal transmission rate of the first wire is compensated and increased, so as to reduce the intra pair skew of the differential paired cable.

In some embodiments, when a signal transmission rate of the first wire is lower than a signal transmission rate of the second wire, a length of the first insulating layer exposed outside of the shielding layer is equal to a length of the second insulating layer exposed outside of the shielding layer, a length of the welding portion of the first wire is equal to a length of the welding portion of the second wire, and by controlling a diameter of the second wire to be smaller than a diameter of the first wire by more than 0.005 mm, the signal transmission rate of the second wire is compensated and decreased, so as to reduce the intra pair skew of the differential paired cable.

In some embodiments, when a signal transmission rate of the first wire is lower than a signal transmission rate of the second wire, a length of the first insulating layer exposed outside of the shielding layer is equal to a length of the second insulating layer exposed outside of the shielding layer, a diameter of the first wire is equal to a diameter of the second wire, and by controlling a length of the welding portion of the first wire to be shorter than a length of the welding portion of the second wire by more than about 0.05 mm, the signal transmission rate of the first wire is compensated and increased, so as to reduce the intra pair skew of the differential paired cable.

In some embodiments, when a signal transmission rate of the first wire is lower than a signal transmission rate of the second wire, a length of the welding portion of the first wire is equal to a length of the welding portion of the second wire, by controlling a length of the first insulating layer exposed outside of the shielding layer to be shorter than a length of the second insulating layer exposed outside of the shielding layer by more than about 0.1 mm, the signal transmission rate of the first wire is compensated and increased, and at the same time, by controlling a diameter of the second wire to be smaller than a diameter of the first wire by more than 0.005 mm, the signal transmission rate is compensated and decreased, so as to reduce the intra pair skew of the differential paired cable.

In some embodiments, when a signal transmission rate of the first wire is lower than a signal transmission rate of the second wire, a diameter of the first wire is equal to a diameter of the second wire, by controlling a length of the first insulating layer exposed outside of the shielding layer to be shorter than a length of the second insulating layer exposed outside of the shielding layer by more than 0.1 mm, and by controlling a length of the welding portion of the first wire to be shorter than a length of the welding portion of the second wire by more than about 0.05 mm, the signal transmission rate of the first wire is compensated and increased, so as to reduce the intra pair skew of the differential paired cable.

In some embodiments, when a signal transmission rate of the first wire is lower than a signal transmission rate of the second wire, a length of the first insulating layer exposed outside of the shielding layer is equal to a length of the second insulating layer exposed outside of the shielding layer, by controlling a diameter of the second wire to be smaller than a diameter of the first wire by more than 0.005 mm, the signal transmission rate of the second wire is compensated and decreased, and at the same time, by controlling a length of the welding portion of the first wire to be shorter than a length of the welding portion of the second wire by more than about 0.05 mm, the signal transmission rate of the first wire is compensated and increased, so as to reduce the intra pair skew of the differential paired cable.

In some embodiments, when a signal transmission rate of the first wire is lower than a signal transmission rate of the second wire, by controlling a length of the first insulating layer exposed outside of the shielding layer to be shorter than a length of the second insulating layer exposed outside of the shielding layer by more than about 0.1 mm, by controlling a length of the welding portion of the first wire to be shorter than a length of the welding portion of the second wire by more than about 0.05 mm, the signal transmission rate of the first wire is compensated and increased, and at the same time, by controlling a diameter of the second wire to be smaller than a diameter of the first wire by more than 0.005 mm, the signal transmission rate of the second wire is compensated and decreased, so as to reduce the intra pair skew of the differential paired cable.

In some embodiments, the length difference between the first insulating layer and the second insulating layer exposed outside of the shielding layer is controlled between 0.15 and 0.25 mm.

In some embodiments, the diameter difference between the first wire and the second wire is controlled between 0.02 and 0.05 mm.

In some embodiments, the length difference between the welding portion of the first wire and the welding portion of the second wire is controlled between 0.1 and 0.2 mm The effect of the present invention is that the signal transmission rate of one of the first wire and the second wire can be compensated by the compensation function, so as to reduce the intra pair skew of the differential paired cable.

DETAILED DESCRIPTION OF THE PREFERRED EMBODIMENT

The embodiments of the present invention will be described in more detail below in conjunction with the drawings and component symbols, so that those familiar with the art can implement them after studying this specification.

Figure 1:
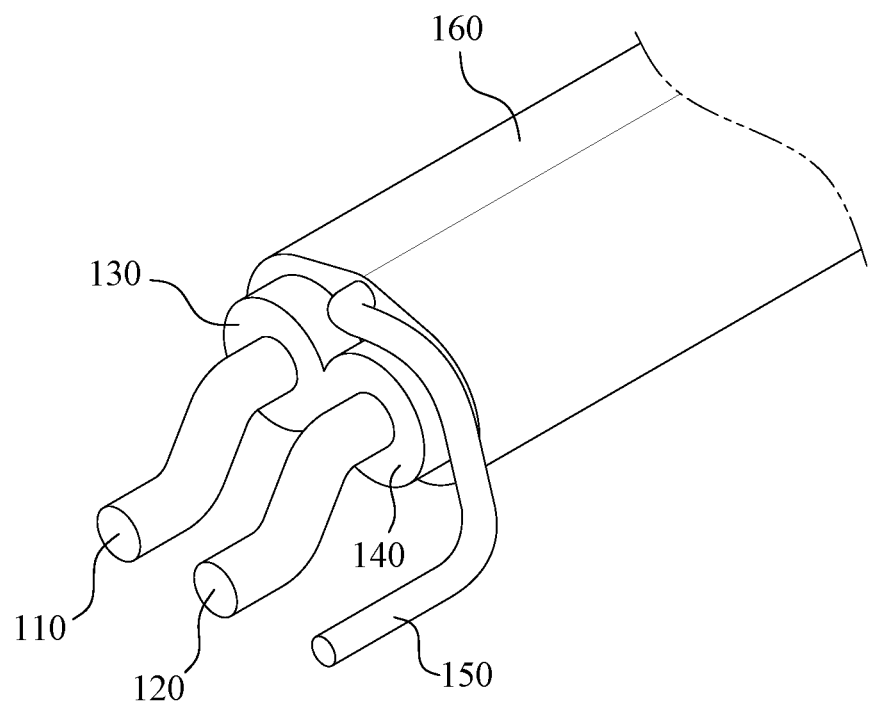
FIG. 1 is a perspective view of a conventional differential paired cable.
Figure 2:
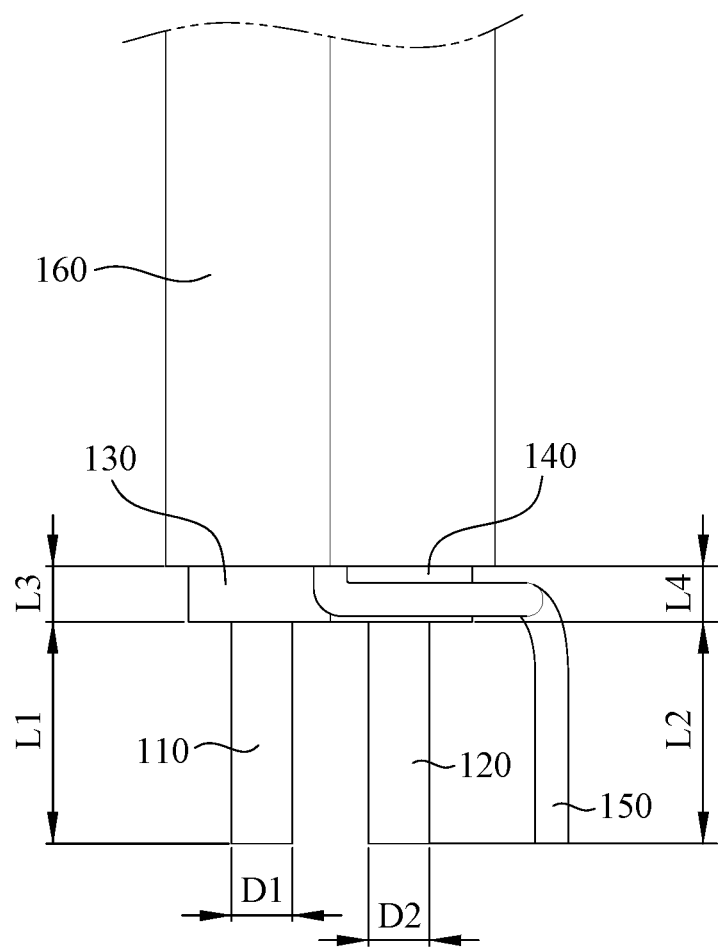
FIG. 2 is a top view of a conventional differential paired cable.
Figure 3:
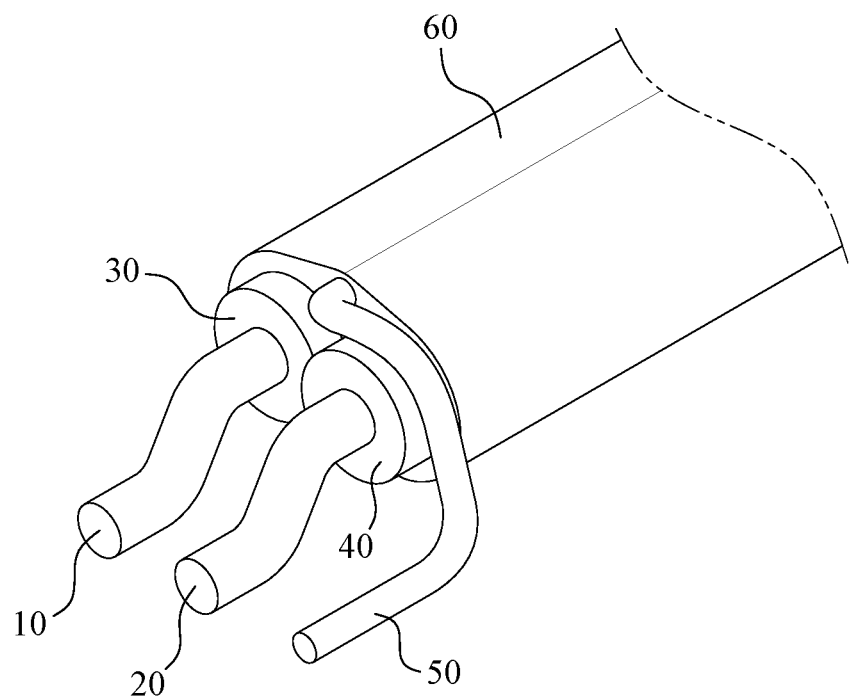
FIG. 3 is a perspective view of the first embodiment of the differential paired cable of the present invention.
Figure 4:
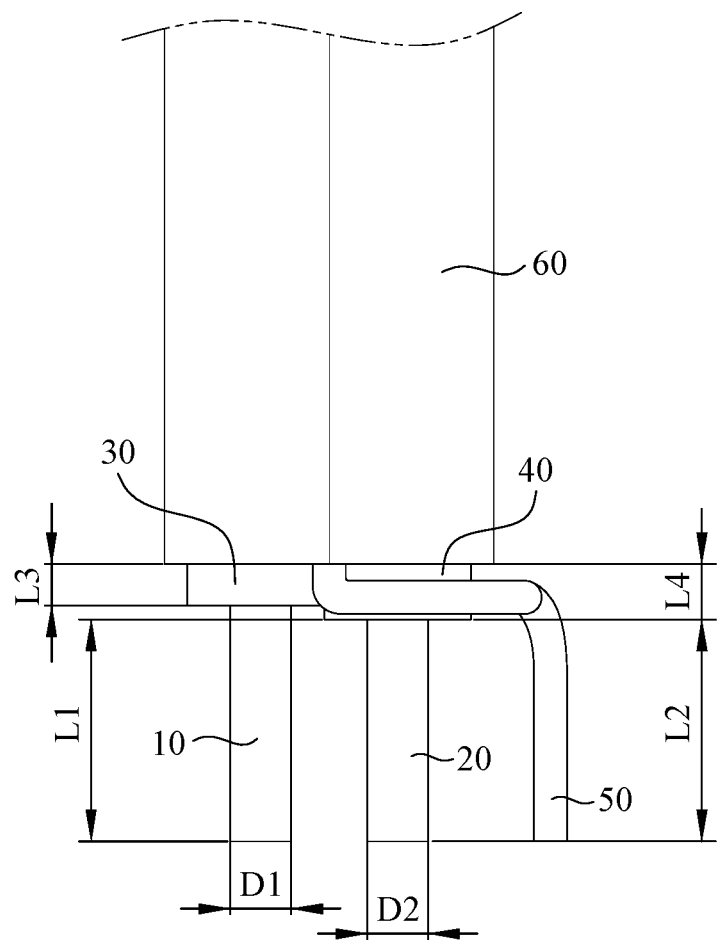
FIG. 4 is a top view of the first embodiment of the differential paired cable of the present invention.

FIG. 3 is a perspective view of the first embodiment of the differential paired cable 1 of the present invention, and FIG. 4 is a top view of the first embodiment of the differential paired cable 1 of the present invention. As shown in FIG. 3 and FIG. 4, the present invention provides a differential paired cable 1 with compensation function, comprising a first wire 10, a second wire 20, a first insulating layer 30, a second insulating layer 40, a ground wire 50 and a shielding layer 60. The first insulating layer 30 covers an outer surface of the first wire 10, and one end of the first wire 10 is exposed outside of the first insulating layer 30. The second insulating layer 40 covers an outer surface of the second wire 20, and one end of the second wire 20 is exposed outside of the second insulating layer 40. The shielding layer 60 is covered on an outer surface of the first insulating layer 30, an outer surface of the second insulating layer 40 and an outer surface of the ground wire 50, and, one end of the first insulating layer 30, one end of the second insulating layer 40, and one end of the ground wire 50 are respectively exposed outside of the shielding layer 60, and one end of the first wire 10 and one end of the second wire 20 are welded to one end of the ground wire 50. By controlling a length difference between the first insulating layer 30 and the second insulating layer 40 exposed to the shielding layer 60 to be greater than 0.1 mm, a signal transmission rate of one of the first wire 10 and the second wire 20 is compensated, thus, the intra pair skew of the differential paired cable 1 is reduced.

Specifically, as shown in FIG. 3 and FIG. 4, in the first embodiment, when a signal transmission rate of the first wire 10 is lower than a signal transmission rate of the second wire 20, a diameter D1 of the first wire 10 is equal to a diameter D2 of the second wire 20, a length L1 of a welding portion of the first wire 10 is equal to a length L2 of a welding portion of the second wire 20, by controlling a length L3 of the first insulating layer 30 exposed outside of the shielding layer 60 to be about 0.1 mm shorter than a length L4 of the second insulating layer 40 exposed outside of the shielding layer 60, the signal transmission rate of the first wire 10 is compensated and increased, thus, the intra pair skew of the differential paired cable 1 is reduced.

More specifically, because the length L3 of the first insulating layer 30 exposed outside of the shielding layer 60 is shorter than the length L4 of the second insulating layer 40 exposed outside of the shielding layer 60, the length of the first wire 10 exposed outside of the first insulating layer 30 is longer than the length of the second wire 20 exposed outside of the second insulating layer 40, and the dielectric constant of one end of the first wire 10 that is not covered by the first insulating layer 30 will become the same as air (the dielectric constant of air is 1), therefore, the signal transmission rate of the first wire 10 will increase, which would reduce the difference between the signal transmission rates of the first wire 10 and the second wire 20 (that is, the intra pair skew of the differential paired cable 1). The above compensation function can effectively reduce the intra pair skew of the differential paired cable 1.

In terms of the structure of the conventional differential paired cable, the lengths of the first insulating layer and the second insulating layer exposed outside of the shielding layer are between 0.5 and 1.0 mm (millimeters), and the length difference between the first insulating layer and the second insulating layer exposed outside of the shielding layer is controlled to be less than 0.1 mm, and the intra pair skew of conventional differential paired cable is between 5-15 ps/m (picosecond/meter). For example, the length difference between the first insulating layer and the second insulating layer exposed to the shielding layer is controlled at 0.02 mm, and the intra pair skew of a conventional differential paired cable is 6.3 ps/m.

Figure 5:
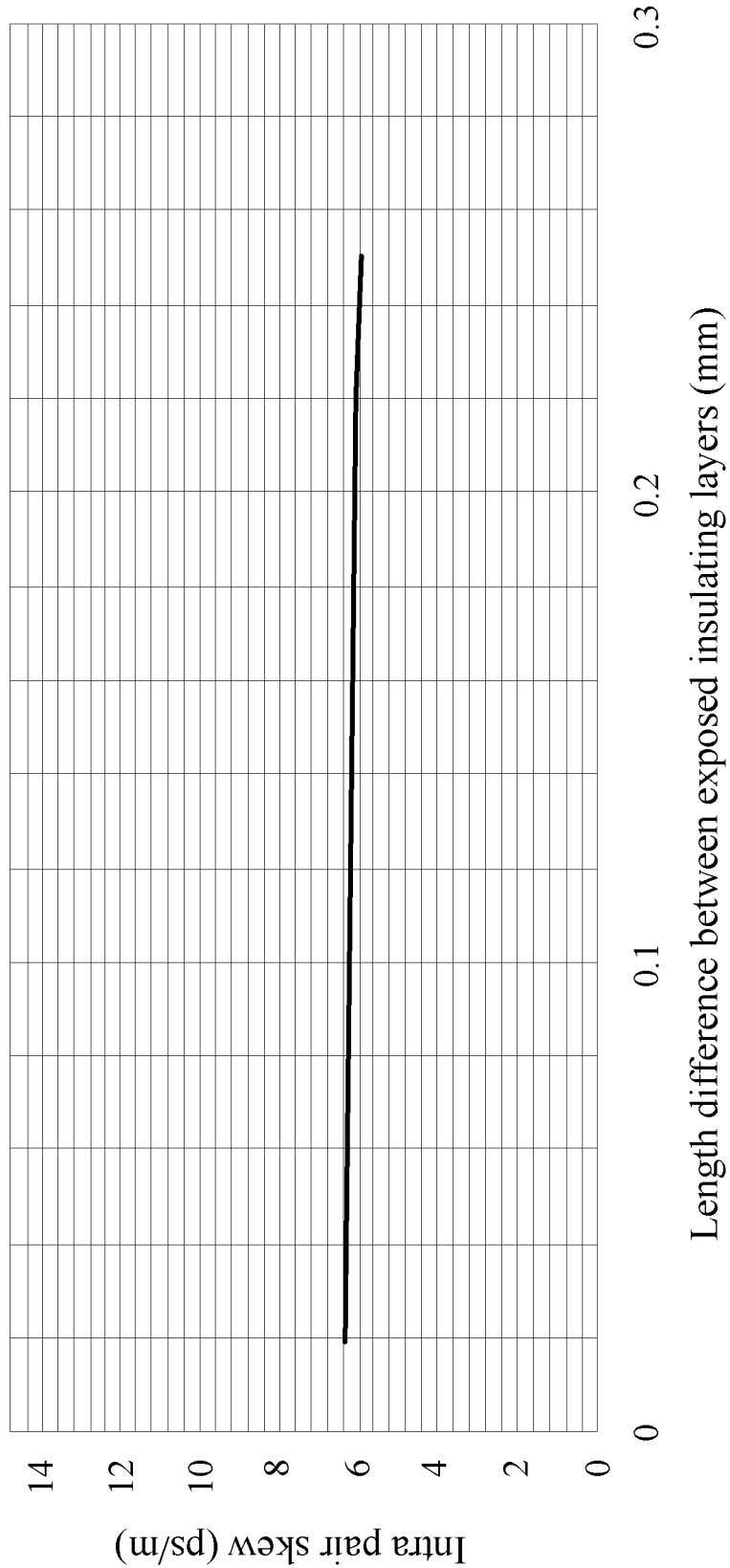
FIG. 5 is a graph of the intra pair skew of the first embodiment of the differential paired cable of the present invention.

FIG. 5 is a graph of the intra pair skew of the first embodiment of the differential paired cable 1 of the present invention. As shown in FIG. 5, and referring to FIG. 3 and FIG. 4, preferably, the length difference between the first insulating layer 30 and the second insulating layer 40 exposed outside of the shielding layer 60 is controlled between 0.15-0.25 mm (that is, the length L3 of the first insulating layer 30 exposed outside of the shielding layer 60 is shorter than the length L4 of the second insulating layer 40 exposed outside of the shielding layer 60 (about 0.15-0.25 mm), so that the signal transmission rate of the first wire 10 is compensated and increased, that is, the intra pair skew of differential paired cable 1 is between 5.9 and 6.1 ps/m. Compared with the conventional differential paired cable, the first embodiment can reduce the intra pair skew of the differential paired cable 1 by about 0.2-0.4 ps/m through the above compensation function.

Although the compensation function of the first embodiment has a small improvement on the intra pair skew of the differential paired cable 1, it has the advantage of being easy to control the accuracy of the differential paired cable 1 in terms of manufacturing process, and can accurately fine-tune the intra pair skew of the differential paired cable 1.

Figure 6:
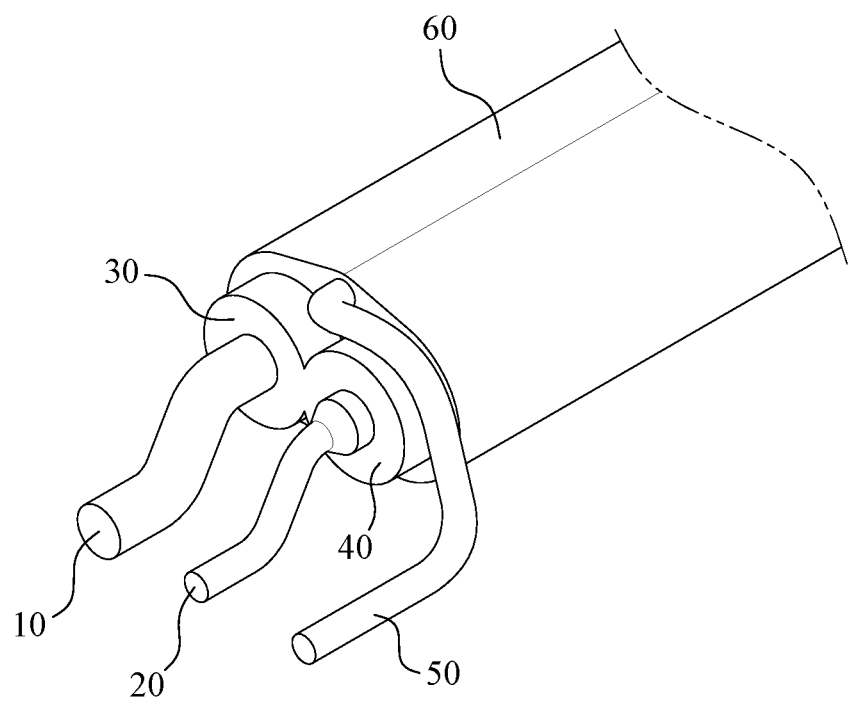
FIG. 6 is a perspective view of the second embodiment of the differential paired cable of the present invention.
Figure 7:
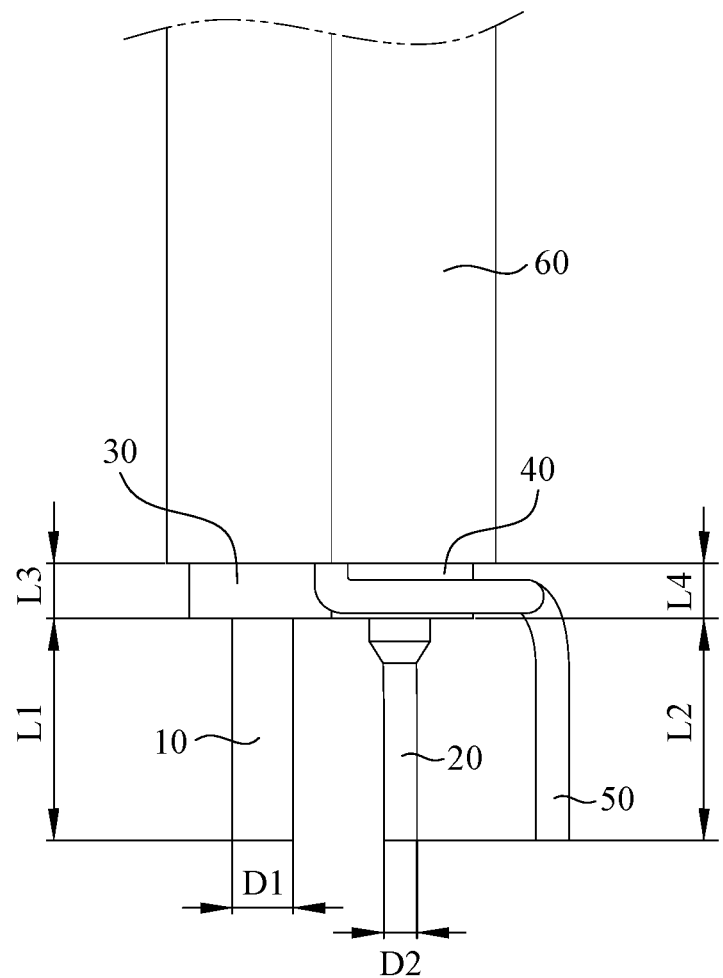
FIG. 7 is a top view of the second embodiment of the differential paired cable of the present invention.

FIG. 6 is a perspective view of the second embodiment of the differential paired cable 1A of the present invention, and FIG. 7 is a top view of the second embodiment of the differential paired cable 1A of the present invention. As shown in FIGS. 6 and 7, the difference between the second embodiment and the first embodiment is: by controlling a diameter difference between the first wire 10 and the second wire 20 to be greater than 0.005 mm, the signal transmission rate of one of the first wire 10 and the second wire 20 is compensated, so as to reduce the intra pair skew of the differential paired cable 1A.

Specifically, as shown in FIG. 6 and FIG. 7, in the second embodiment, when the signal transmission rate of the first wire 10 is lower than the signal transmission rate of the second wire 20, the length L3 of the first insulating layer 30 exposed outside of the shielding layer 60 is equal to the length L4 of the second insulating layer 40 exposed outside of the shielding layer 60, and the length L1 of the welding portion of the first wire 10 is equal to the length L2 of the welding portion of the second wire 20. By controlling the diameter D2 of the second wire 20 to be smaller than the diameter D1 of the first wire 10 by more than 0.005 mm, the signal transmission rate of the second wire 20 is compensated and decreased, so as to reduce the intra pair skew of the differential paired cable 1A.

In more detail, because the diameter D2 of the second wire 20 is smaller than the diameter D1 of the first wire 10, the impedance of the second wire 20 is larger than the impedance of the first wire 10, so the signal transmission rate of the second wire 20 would decrease, reducing the difference between the signal transmission rates between the first wire 10 and the second wire 20 (that is, the intra pair skew of the differential paired cable 1A).

In terms of the structure of the conventional differential paired cable, the diameter difference between the first wire and the second wire is less than 0.005 mm, and the in-pair delay difference of the conventional differential paired cable is greater than 10 ps/m. For example, the diameter difference between the first wire and the second wire is controlled at 0.001 mm, and the intra pair skew of a conventional differential paired cable is 10.82 ps/m.

Figure 8:
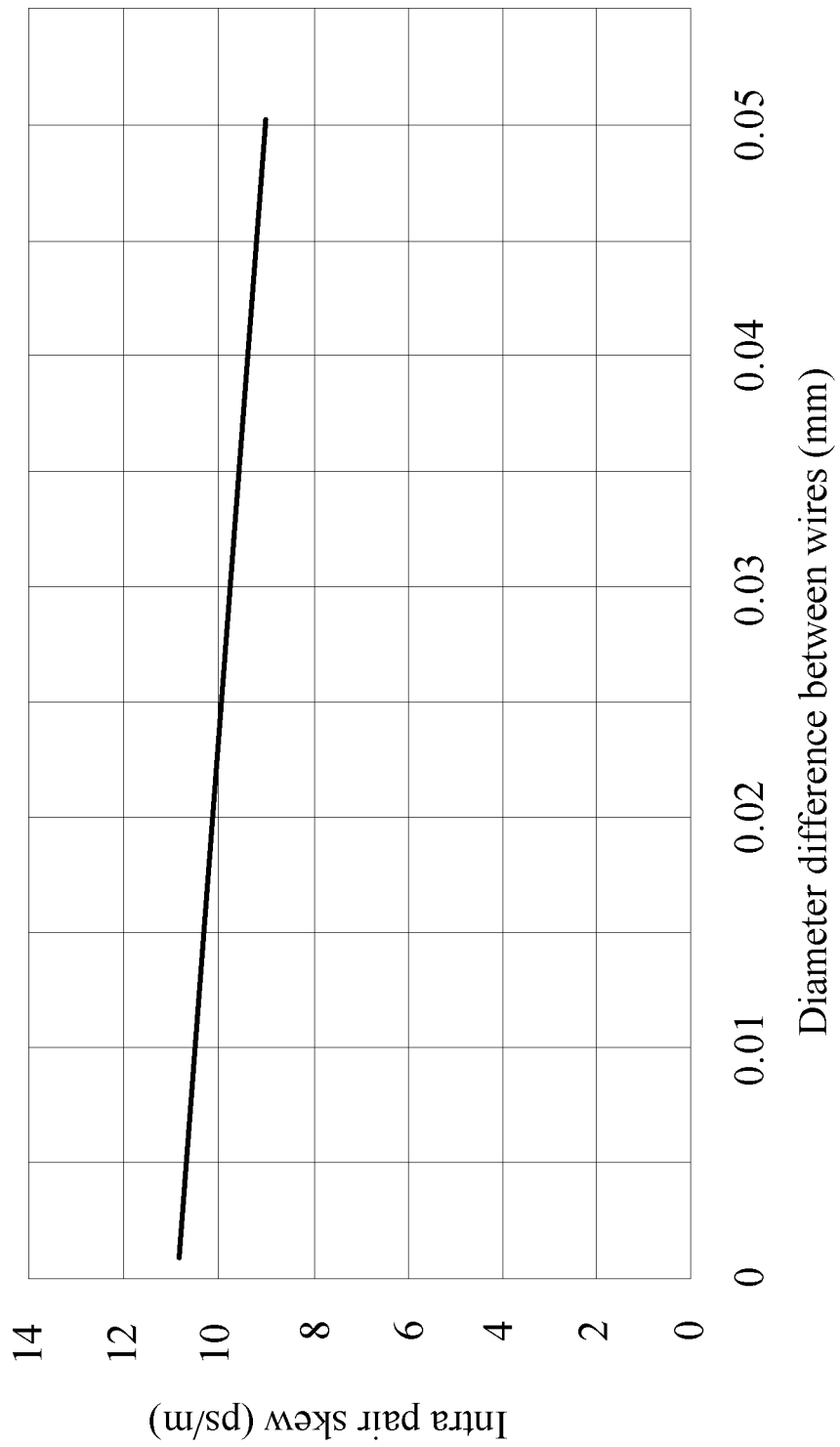
FIG. 8 is a graph of the intra pair skew of the second embodiment of the differential paired cable of the present invention.

FIG. 8 is a graph of the intra pair skew of the second embodiment of the differential paired cable 1A of the present invention. As shown in FIG. 8, and referring to FIG. 6 and FIG. 7, preferably, the diameter difference between the first wire 10 and the second wire 20 is controlled between 0.02-0.05 mm (that is, the diameter D2 of the second wire 20 is 0.02-0.05 mm smaller than the diameter D1 of the first wire 10), so that the signal transmission rate of the second wire 20 is compensated and decreased, and the intra pair skew of the differential paired cable 1A is between 8.97-10.1 ps/m. Compared with the conventional differential paired cable, the second embodiment can reduce the intra pair skew of the differential paired cable 1A by about 0.72-1.85 ps/m through the above compensation function. Compared with the first embodiment, the compensation function of the second embodiment significantly improves the intra pair skew of the differential paired cable 1A.

Figure 9:
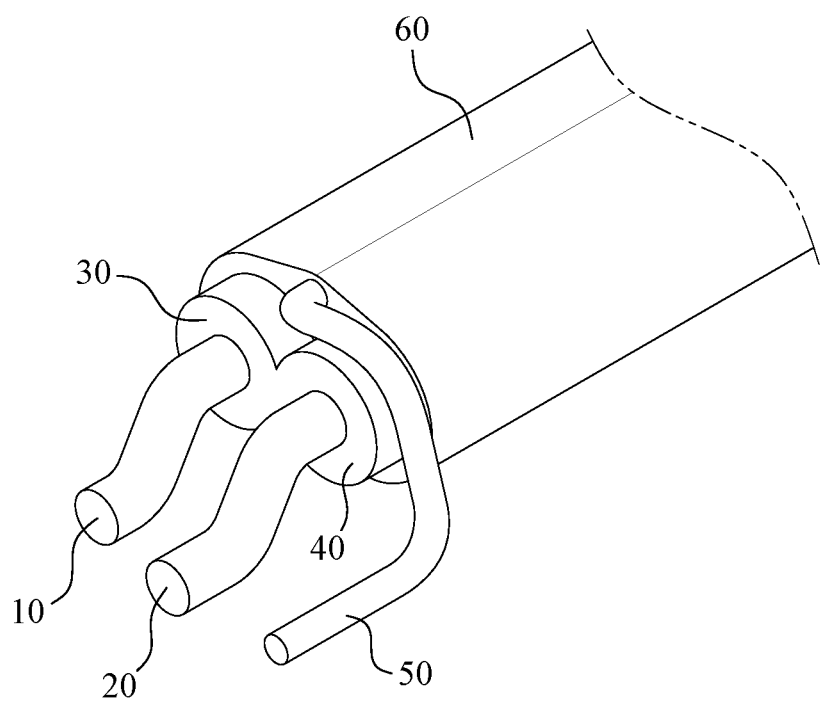
FIG. 9 is a perspective view of a third embodiment of the differential paired cable of the present invention.
Figure 10:
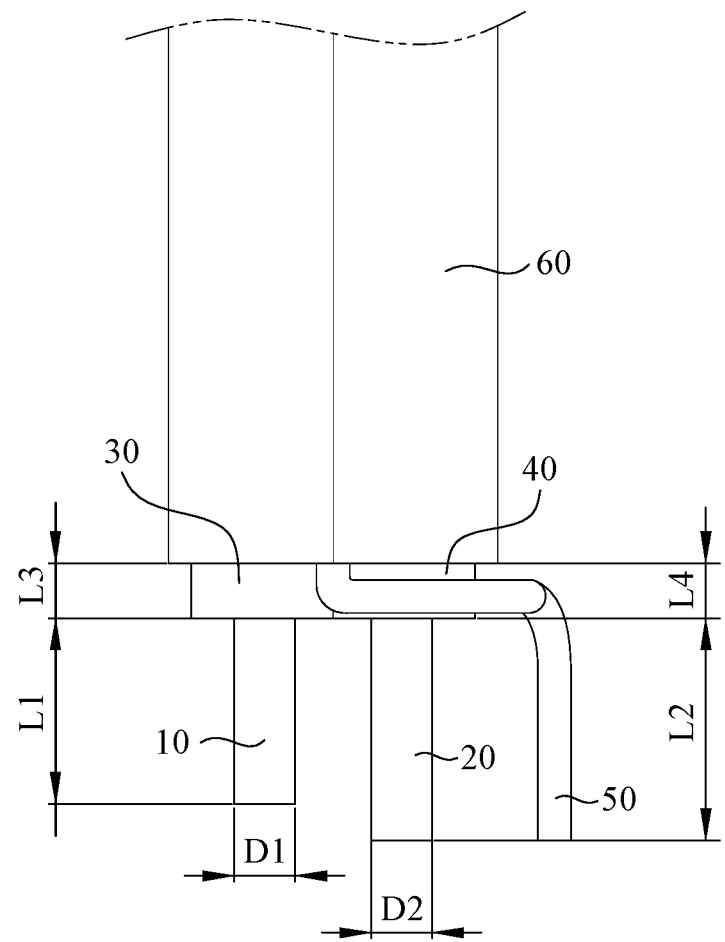
FIG. 10 is a top view of a third embodiment of the differential paired cable of the present invention.

FIG. 9 is a perspective view of the third embodiment of the differential paired cable 1B of the present invention, and FIG. 10 is a top view of the third embodiment of the differential paired cable 1B of the present invention. As shown in FIGS. 9 and 10, the difference between the third embodiment and the preceding embodiments is that: by controlling a length difference between the welding portion of the first wire 10 and the welding portion of the second wire 20 to be greater than 0.05 mm, the signal transmission rate of one of the first wire 10 and the second wire 20 is compensated to reduce the intra pair skew of the differential paired cable 1B.

Specifically, as shown in FIG. 9 and FIG. 10, in the third embodiment, when the signal transmission rate of the first wire 10 is lower than the signal transmission rate of the second wire 20, the length L3 of the first insulating layer 30 exposed outside of the shielding layer 60 is equal to the length L4 of the second insulating layer 40 exposed outside of the shielding layer 60, and the diameter D1 of the first wire 10 is equal to the diameter D2 of the second wire 20. By controlling the length L1 of the welding portion of the first wire 10 to be about 0.05 mm shorter than the length L2 of the welding portion of the second wire 20, the signal transmission rate of the first wire 10 is compensated and increased, so as to reduce the intra pair skew of the differential paired cable 1B.

In more detail, because the length L1 of the welding portion of the first wire 10 is shorter than the length L2 of the welding portion of the second wire 20, the signal transmission time of the first wire 10 is shorter than the signal transmission time of the second wire 20, so the signal transmission rate of the first wire 10 will increase, and the difference between the signal transmission rates of the first wire 10 and the second wire 20 (that is, the intra pair skew of the differential paired cable 1B) would be reduced. Thus, the above compensation function can effectively reduce the intra pair skew of the differential paired cable 1B.

In terms of the structure of the conventional differential paired cable, the length difference between the first wire and the second wire is less than 0.05 mm, and the intra pair skew of the conventional differential paired cable is greater than 13 ps/m. For example, the length difference between the first wire and the second wire is controlled at 0.03 mm, and the intra pair skew of a conventional differential paired cable is 13.19 ps/m.

Figure 11:
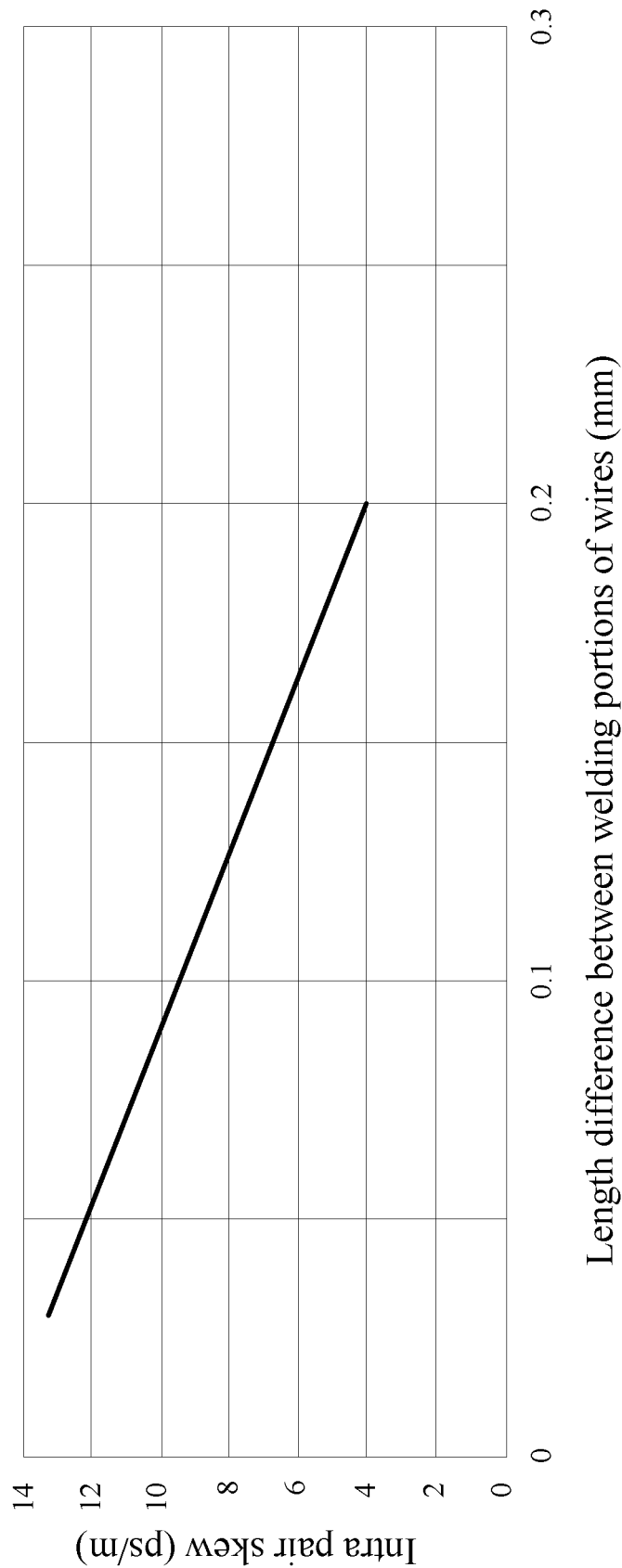
FIG. 11 is a graph of the intra pair skew of the third embodiment of the differential paired cable of the present invention.

FIG. 11 is a graph of the intra pair skew of the third embodiment of the differential paired cable 1B of the present invention. As shown in FIG. 11, and referring to FIG. 9 and FIG. 10, preferably, the length difference between the first wire 10 and the second wire 20 is controlled between 0.1-0.2 mm (that is, the length L1 of the welding portion of the first wire 10 is shorter than the length L2 of the welding portion of the second wire 20 (about 0.1-0.2 mm)), so that the signal transmission rate of the first wire 10 is compensated and increased, and the intra pair skew of the differential paired cable 1B is between 4-9.5 ps/m. Compared with the conventional differential paired cable, the third embodiment can reduce the intra pair skew of the differential paired cable 1B by about 3.69-9.19 ps/m through the above compensation function. Compared with the foregoing embodiments, the compensation function of the third embodiment is most significant for improving the intra pair skew of the differential paired cable 1B.

Figure 12:
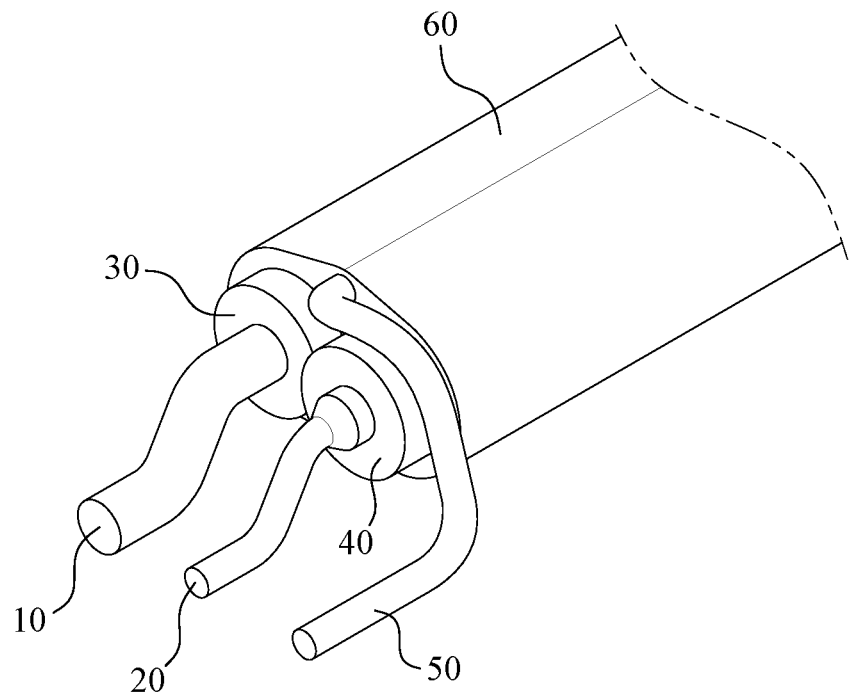
FIG. 12 is a perspective view of a fourth embodiment of the differential paired cable of the present invention.
Figure 13:
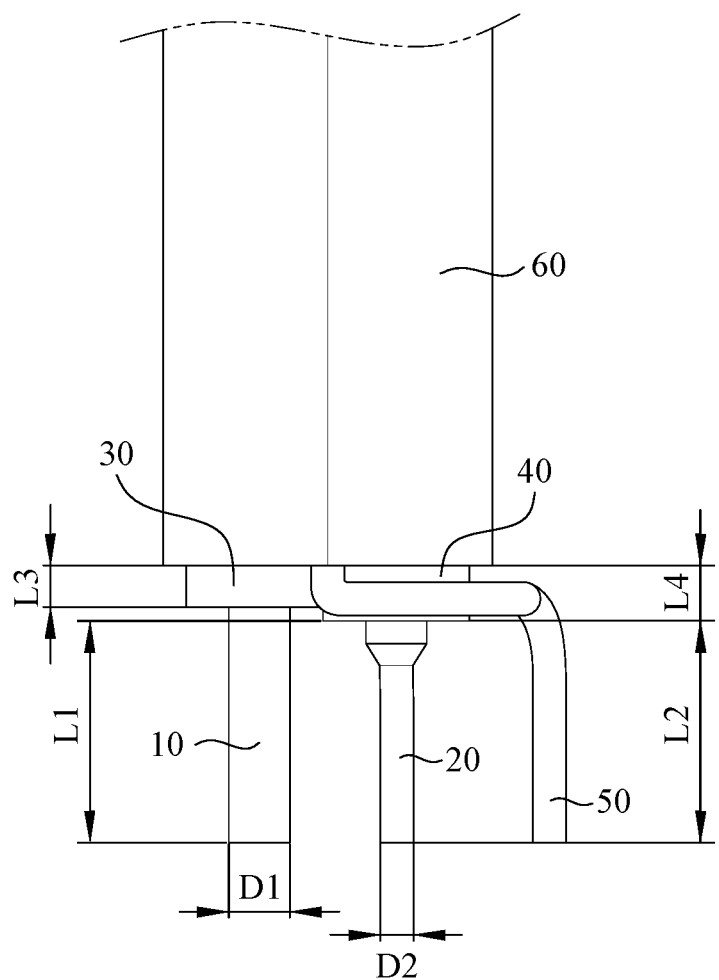
FIG. 13 is a top view of a fourth embodiment of the differential paired cable of the present invention.

FIG. 12 is a perspective view of the fourth embodiment of the differential paired cable 1C of the present invention, and FIG. 13 is a top view of the fourth embodiment of the differential paired cable 1C of the present invention. As shown in FIG. 12 and FIG. 13, the difference between the fourth embodiment and the previous embodiment is: by controlling the difference in the length of the first insulating layer 30 and the second insulating layer 40 exposed outside of the shielding layer 60 to be greater than 0.1 mm, and by controlling the diameter difference between the first wire 10 and the second wire 20 to be greater than 0.005 mm, the signal transmission rate of one of the first wire 10 and the second wire 20 is compensated, so as to reduce the intra pair skew of the differential paired cable 1C.

Specifically, as shown in FIG. 12 and FIG. 13, in the fourth embodiment, when the signal transmission rate of the first wire 10 is lower than the signal transmission rate of the second wire 20, the length L1 of the welding portion of the first wire 10 is equal to the length L2 of the welding portion of the second wire 20, by controlling the length L3 of the first insulating layer 30 exposed outside of the shielding layer 60 to be about 0.1 mm shorter than the length L4 of the second insulating layer 40 exposed outside of the shielding layer 60, the signal transmission rate of the first wire 10 is compensated and increased, and at the same time, by controlling the diameter D2 of the second wire 20 to be smaller than the diameter D1 of the first wire 10 by more than 0.005 mm, the signal transmission rate of the second wire 20 is compensated and decrease, so as to reduce the intra pair skew of the differential paired cable 1C. In other words, the fourth embodiment includes the two compensation functions of the first embodiment and the second embodiment, and thus can effectively reduce the intra pair skew of the differential paired cable 1C.

Figure 14:
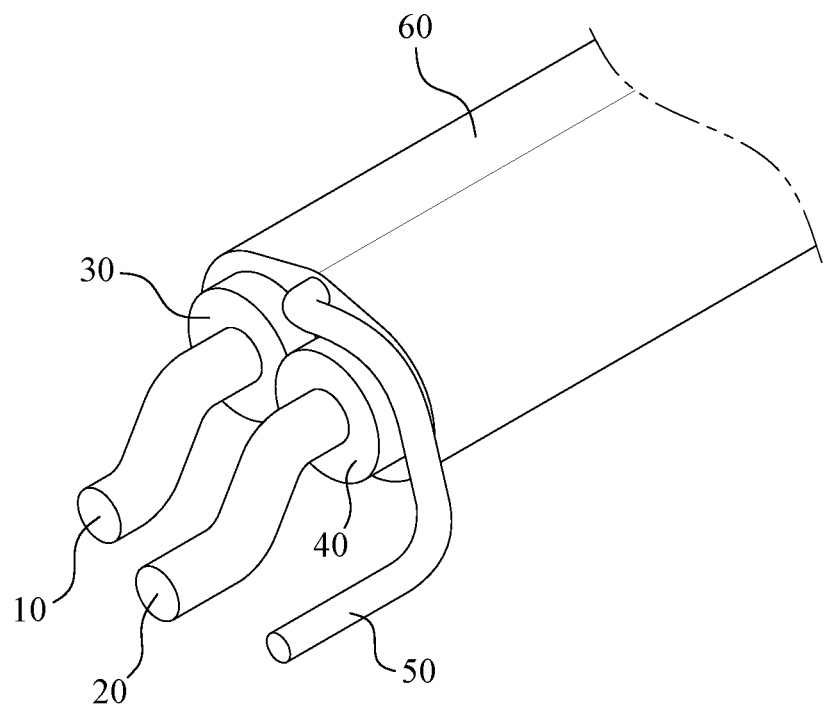
FIG. 14 is a perspective view of a fifth embodiment of the differential paired cable of the present invention.
Figure 15:
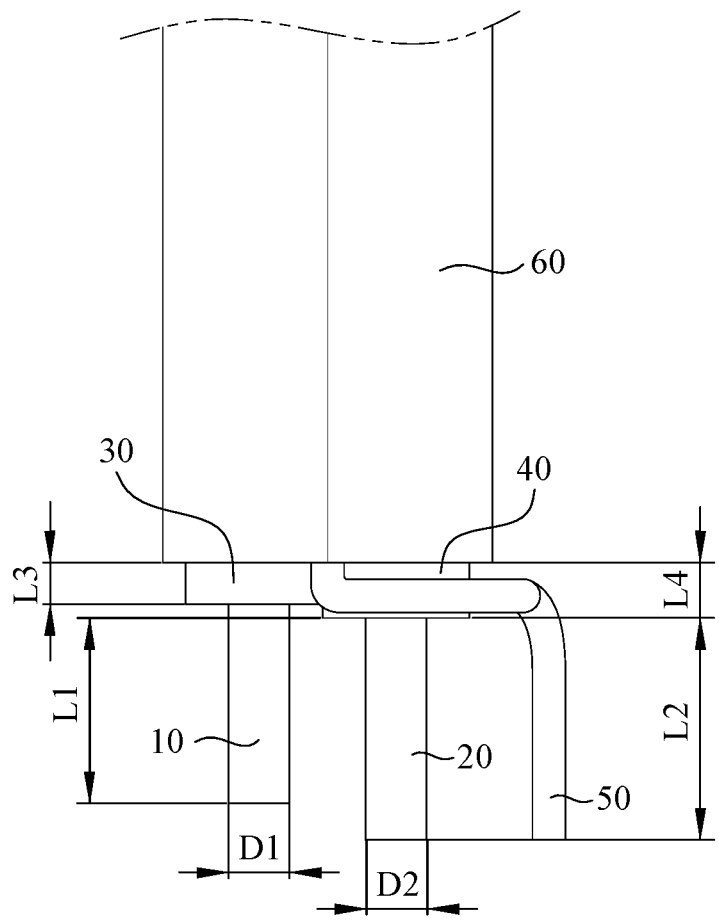
FIG. 15 is a top view of a fifth embodiment of the differential paired cable of the present invention.

FIG. 14 is a perspective view of the fifth embodiment of the differential paired cable 1D of the present invention, and FIG. 15 is a top view of the fifth embodiment of the differential paired cable 1D of the present invention. As shown in FIG. 14 and FIG. 15, the difference between the fifth embodiment and the preceding embodiments is: by controlling the difference in the length of the first insulating layer 30 and the second insulating layer 40 exposed outside of the shielding layer 60 to be greater than 0.1 mm, and by controlling the difference in length between the welding portion of the first wire 10 and the welding portion of the second wire 20 to be greater than 0.05 mm, the signal transmission rate of one of the first wire 10 and the second wire 20 is compensated to reduce the intra pair skew of the differential paired cable 1D.

Specifically, as shown in FIG. 14 and FIG. 15, in the fifth embodiment, when the signal transmission rate of the first wire 10 is lower than the signal transmission rate of the second wire 20, the diameter D1 of the first wire 10 is equal to the diameter D2 of the second wire 20, by controlling the length L3 of the first insulating layer 30 exposed outside of the shielding layer 60 to be shorter than the length L4 of the second insulating layer 40 exposed outside of the shielding layer 60 by more than about 0.1 mm, and by controlling the length L1 of the welding portion of the first wire 10 to be shorter than the length L2 of the welding portion of the second wire 20 by about 0.05 mm or more, the signal transmission rate of the first wire 10 is compensated and increased, so as to reduce the intra pair skew of the differential paired cable 1D. In other words, the fifth embodiment includes the two compensation functions of the first embodiment and the third embodiment, and thus can effectively reduce the intra pair skew of the differential paired cable 1D.

Figure 16:
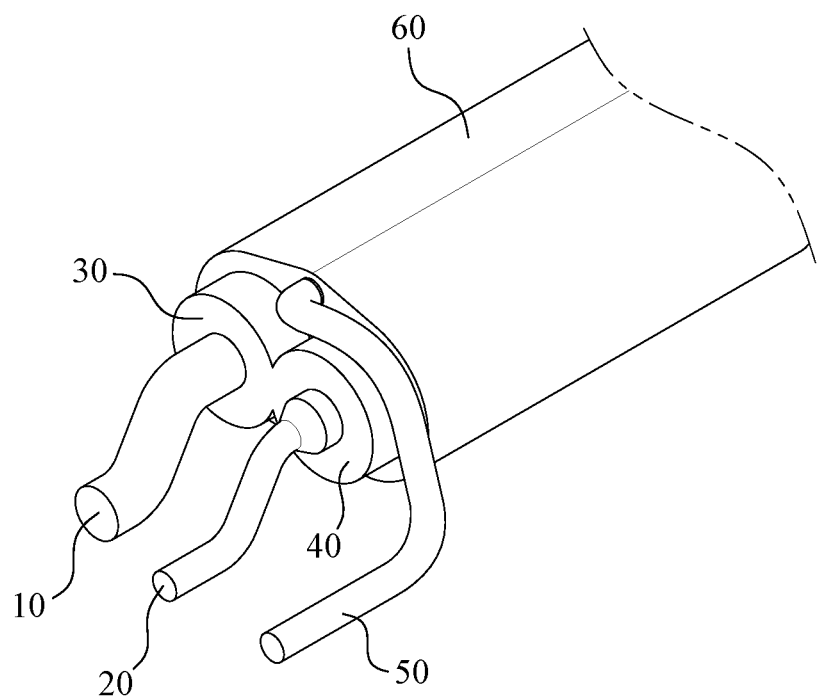
FIG. 16 is a perspective view of a sixth embodiment of the differential paired cable of the present invention.
Figure 17:
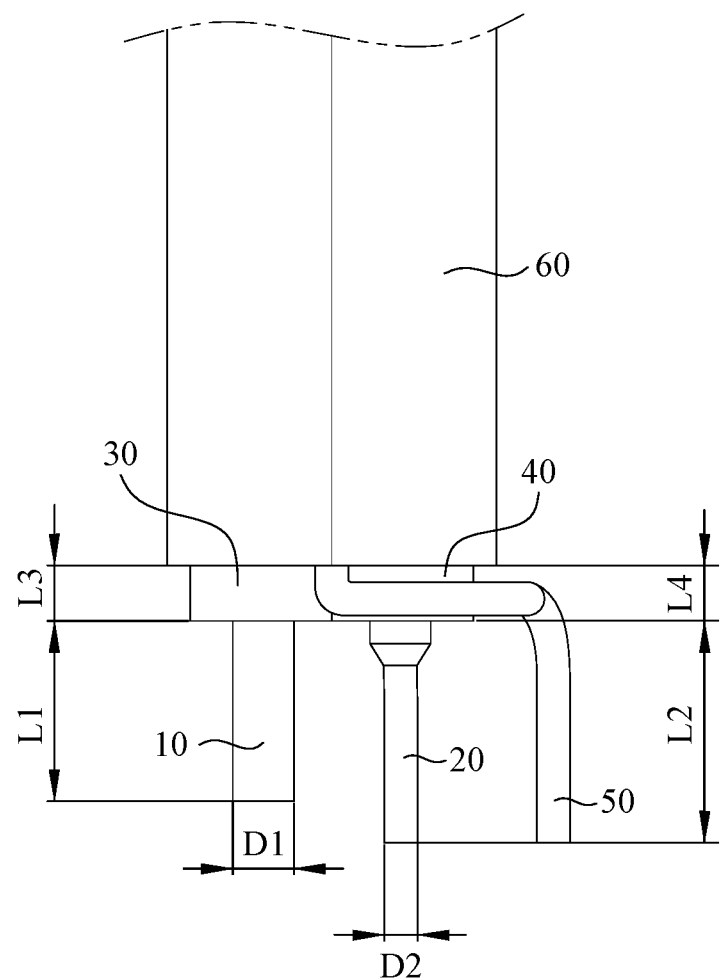
FIG. 17 is a top view of the sixth embodiment of the differential paired cable of the present invention.

FIG. 16 is a perspective view of the sixth embodiment of the differential paired cable 1E of the present invention, and FIG. 17 is a top view of the sixth embodiment of the differential paired cable 1E of the present invention. As shown in FIG. 16 and FIG. 17, the difference between the sixth embodiment and the preceding embodiments is: by controlling the diameter difference between the first wire 10 and the second wire 20 to be greater than 0.005 mm, and by controlling the length difference between the welding portion of the first wire 10 and the second wire 20 to be greater than 0.05 mm, the signal transmission rate of one of the first wire 10 and the second wire 20 is compensated to reduce the intra pair skew of the differential paired cable 1E.

Specifically, as shown in FIG. 16 and FIG. 17, in the sixth embodiment, when the signal transmission rate of the first wire 10 is lower than the signal transmission rate of the second wire 20, the length L3 of the first insulating layer 30 exposed outside of the shielding layer 60 is equal to the length L4 of the second insulating layer 40 exposed outside of the shielding layer 60. By controlling the diameter D2 of the second wire 20 to be less than 0.005 mm or more than the diameter D1 of the first wire 10, the signal transmission rate is compensated and decreased. At the same time, by controlling the length L1 of the welding portion of the first wire 10 to be shorter than the length L2 of the welding portion of the second wire 20 by more than 0.05 mm, the signal transmission rate of the first wire 10 is compensated and increased, so as to reduce the intra pair skew of the differential paired cable 1E. In other words, the sixth embodiment includes the two compensation functions of the second embodiment and the third embodiment, and thus can effectively reduce the intra pair skew of the differential paired cable 1E.

Figure 18:
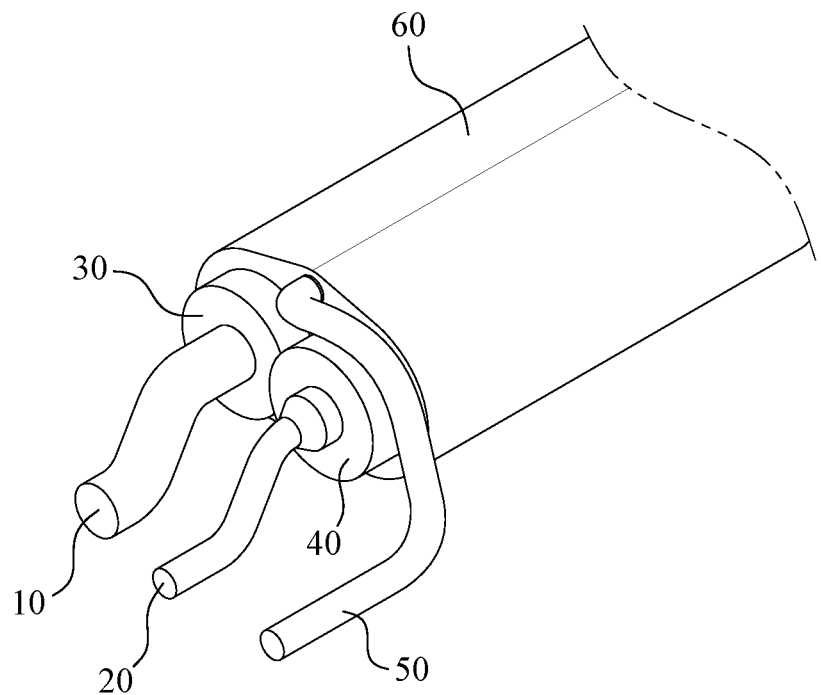
FIG. 18 is a perspective view of a seventh embodiment of the differential paired cable of the present invention.
Figure 19:
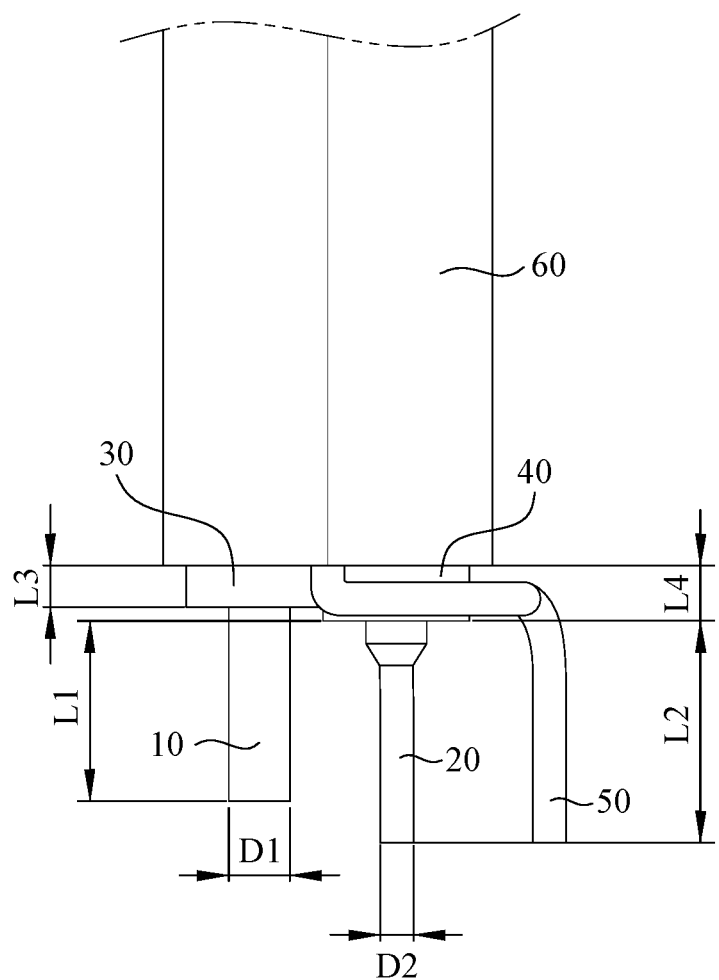
FIG. 19 is a top view of a seventh embodiment of the differential paired cable of the present invention.

FIG. 18 is a perspective view of the seventh embodiment of the differential paired cable 1F of the present invention, and FIG. 19 is a top view of the seventh embodiment of the differential paired cable 1F of the present invention. As shown in FIG. 18 and FIG. 19, the difference between the seventh embodiment and the previous embodiments is that: by controlling the difference in the length of the first insulating layer 30 and the second insulating layer 40 exposed outside of the shielding layer 60 to be greater than 0.1 mm, by controlling the diameter difference between the first wire 10 and the second wire 20 to be greater than 0.005 mm, and by controlling the length difference between the welding portion of the first wire 10 and the welding portion of the second wire 20 to be greater than 0.05 mm, the signal transmission rate of one of the first wire 10 and the second wires 20 is compensated.

Specifically, as shown in FIG. 18 and FIG. 19, in the seventh embodiment, when the signal transmission rate of the first wire 10 is lower than the signal transmission rate of the second wire 20, by controlling the length L3 of the first insulating layer 30 exposed outside of the shielding layer 60 to be about 0.1 mm shorter than the length L4 of the second insulating layer 40 exposed outside of the shielding layer 60, and by controlling the length L1 of the welding portion of the first wire 10 to be shorter than the length L2 of the welding portion of the second wire 20 by about 0.05 mm, the signal transmission rate of the first wire 10 is compensated and increased. At the same time, by controlling the diameter D2 of the second wire 20 to be smaller than the diameter D1 of the first wire 10 by more than 0.005 mm, the signal transmission rate of the second wire 20 is compensated and decreased, so as to reduce the intra pair skew of the differential paired cable 1F. In other words, the seventh embodiment includes the three compensation functions of the first embodiment, the second embodiment, and the third embodiment, and thus can effectively reduce the intra pair skew of the differential paired cable 1F.

The above are only preferred embodiments for explaining the present invention, and are not intended to limit the present invention in any form. Modifications or changes should still be included in the scope of protection intended by the present invention.

What is claimed is:

1. A differential paired cable with compensation functions, including:
   a first wire;
   a second wire;
   a first insulating layer covering an outer surface of the first wire, one end of the first wire being exposed outside of the first insulating layer;
   a second insulating layer covering an outer surface of the second wire, one end of the second wire being exposed outside of the second insulating layer;

a ground wire; and a shielding layer covering an outer surface of the first insulating layer, an outer surface of the second insulating layer and an outer surface of the ground wire, one end of the first insulating layer, one end of the second insulating layer, and one end of the ground wire being respectively exposed outside of the shielding layer, and one end of the first wire and one end of the second wire being welded to one end of the ground wire, wherein by controlling at least one of a length difference between the first insulating layer and the second insulating layer exposed outside of the shielding layer to be greater than 0.1 mm, a diameter difference between the first wire and the second wire to be greater than 0.005 mm, and a length difference between a welding portion of the first wire and a welding portion of the second wire to be greater than 0.05 mm, a signal transmission rate of one of the first wire and the second wire is compensated, so as to reduce an intra pair skew of the differential paired cable.

2. The differential paired cable with compensation functions according to claim 1, wherein when a signal transmission rate of the first wire is lower than a signal transmission rate of the second wire, a diameter of the first wire is equal to a diameter of the second wire, a length of the welding portion of the first wire is equal to a length of the welding portion of the second wire, and by controlling a length of the first insulating layer exposed outside of the shielding layer to be shorter than a length of the second insulating layer exposed outside of the shielding layer by more than about 0.1 mm, the signal transmission rate of the first wire is compensated and increased, so as to reduce the intra pair skew of the differential paired cable.

3. The differential paired cable with compensation functions according to claim 1, wherein when a signal transmission rate of the first wire is lower than a signal transmission rate of the second wire, a length of the first insulating layer exposed outside of the shielding layer is equal to a length of the second insulating layer exposed outside of the shielding layer, a length of the welding portion of the first wire is equal to a length of the welding portion of the second wire, and by controlling a diameter of the second wire to be smaller than a diameter of the first wire by more than 0.005 mm, the signal transmission rate of the second wire is compensated and decreased, so as to reduce the intra pair skew of the differential paired cable.

4. The differential paired cable with compensation functions according to claim 1, wherein when a signal transmission rate of the first wire is lower than a signal transmission rate of the second wire, a length of the first insulating layer exposed outside of the shielding layer is equal to a length of the second insulating layer exposed outside of the shielding layer, a diameter of the first wire is equal to a diameter of the second wire, and by controlling a length of the welding portion of the first wire to be shorter than a length of the welding portion of the second wire by more than about 0.05 mm, the signal transmission rate of the first wire is compensated and increased, so as to reduce the intra pair skew of the differential paired cable.

5. The differential paired cable with compensation functions according to claim 1, wherein when a signal transmission rate of the first wire is lower than a signal transmission rate of the second wire, a length of the welding portion of the first wire is equal to a length of the welding portion of the second wire, by controlling a length of the first insulating layer exposed outside of the shielding layer to be shorter than a length of the second insulating layer exposed outside of the shielding layer by more than about 0.1 mm, the signal transmission rate of the first wire is compensated and increased, and at the same time, by controlling a diameter of the second wire to be smaller than a diameter of the first wire by more than 0.005 mm, the signal transmission rate is compensated and decreased, so as to reduce the intra pair skew of the differential paired cable.

6. The differential paired cable with compensation functions according to claim 1, wherein when a signal transmission rate of the first wire is lower than a signal transmission rate of the second wire, a diameter of the first wire is equal to a diameter of the second wire, by controlling a length of the first insulating layer exposed outside of the shielding layer to be shorter than a length of the second insulating layer exposed outside of the shielding layer by more than about 0.1 mm, and by controlling a length of the welding portion of the first wire to be shorter than a length of the welding portion of the second wire by more than about 0.05 mm, the signal transmission rate of the first wire is compensated and increased, so as to reduce the intra pair skew of the differential paired cable.

7. The differential paired cable with compensation functions according to claim 1, wherein when a signal transmission rate of the first wire is lower than a signal transmission rate of the second wire, a length of the first insulating layer exposed outside of the shielding layer is equal to a length of the second insulating layer exposed outside of the shielding layer, by controlling a diameter of the second wire to be smaller than a diameter of the first wire by more than 0.005 mm, the signal transmission rate of the second wire is compensated and decreased, and at the same time, by controlling a length of the welding portion of the first wire to be shorter than a length of the welding portion of the second wire by more than about 0.05 mm, the signal transmission rate of the first wire is compensated and increased, so as to reduce the intra pair skew of the differential paired cable.

8. The differential paired cable with compensation functions according to claim 1, wherein when a signal transmission rate of the first wire is lower than a signal transmission rate of the second wire, by controlling a length of the first insulating layer exposed outside of the shielding layer to be shorter than a length of the second insulating layer exposed outside of the shielding layer by more than about 0.1 mm, by controlling a length of the welding portion of the first wire to be shorter than a length of the welding portion of the second wire by more than about 0.05 mm, the signal transmission rate of the first wire is compensated and increased, and at the same time, by controlling a diameter of the second wire to be smaller than a diameter of the first wire by more than 0.005 mm, the signal transmission rate of the second wire is compensated and decreased, so as to reduce the intra pair skew of the differential paired cable.

9. The differential paired cable with compensation functions according to claim 1, wherein the length difference between the first insulating layer and the second insulating layer exposed outside of the shielding layer is controlled between 0.15 and 0.25 mm.

10. The differential paired cable with compensation functions according to claim 1, wherein the diameter difference between the first wire and the second wire is controlled between 0.02 and 0.05 mm.

11. The differential paired cable with compensation functions according to claim 1, wherein the length difference between the welding portion of the first wire and the welding portion of the second wire is controlled between 0.1 and 0.2 mm.

\* \* \* \* \*